US010444624B1

(12) United States Patent
Lu et al.

(10) Patent No.: US 10,444,624 B1
(45) Date of Patent: Oct. 15, 2019

(54) ACTIVE METROLOGY FRAME AND THERMAL FRAME TEMPERATURE CONTROL IN IMPRINT LITHOGRAPHY

(71) Applicant: CANON KABUSHIKI KAISHA, Tokyo (JP)

(72) Inventors: Xiaoming Lu, Cedar Park, TX (US); Byung-Jin Choi, Austin, TX (US); Steven Hartmann, Spicewood, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/206,642

(22) Filed: Nov. 30, 2018

(51) Int. Cl.

| | |
|---|---|
| ***G03B 27/42*** | (2006.01) |
| ***G03F 7/00*** | (2006.01) |
| ***B29C 59/00*** | (2006.01) |
| ***B29C 59/02*** | (2006.01) |
| ***G03F 7/20*** | (2006.01) |
| ***G03F 9/00*** | (2006.01) |

(52) U.S. Cl.
CPC .......... *G03F 7/0002* (2013.01); *B29C 59/002* (2013.01); *B29C 59/02* (2013.01); *G03F 7/7085* (2013.01); *G03F 7/70775* (2013.01); *G03F 7/70858* (2013.01); *G03F 9/7042* (2013.01)

(58) Field of Classification Search
CPC ........ G03F 7/0002; G03F 1/36; G03F 9/7042; G03F 7/20; G03F 7/26; G03F 7/7035; G03F 7/2022; B29C 2033/426
See application file for complete search history.

(56) References Cited

U.S. PATENT DOCUMENTS

| | | | |
|---|---|---|---|
| 8,387,482 | B2 | 3/2013 | Choi et al. |
| 8,638,416 | B2 | 1/2014 | Yoshida |
| 9,482,967 | B2 | 11/2016 | Van De Kerkhof et al. |
| 9,696,640 | B2 | 7/2017 | Koevoets et al. |
| 2018/0117805 | A1 | 5/2018 | Choi |

*Primary Examiner* — Mesfin T Asfaw
(74) *Attorney, Agent, or Firm* — Canon U.S.A., Inc. I.P. Division

(57) ABSTRACT

A thermal frame of an imprinting apparatus has an motor and a cooling element. A metrology frame of the imprinting apparatus is coupled to an output end of the motor and receives an imprinting mold. Thermal isolation is provided between the motor and the metrology frame. Thermal sensors are disposed at locations of the frames. A digital controller applies a control signal for controlling a driving signal of the cooling element to maintain a thermal balance, such as thermal equilibrium, of heat flow between the frames. The digital controller uses output of the thermal sensors to identify transfer functions of heat flow used to calculate the control signal. The feedforward design avoids the very low control bandwidth that limits the performance of typical feedback designs.

19 Claims, 9 Drawing Sheets

ACTIVE METROLOGY FRAME AND THERMAL FRAME TEMPERATURE CONTROL IN IMPRINT LITHOGRAPHY

BACKGROUND OF THE INVENTION

Field of the Invention

The present invention relates to imprint lithography. More particularly, the present invention relates to temperature control in nanoimprint lithography.

Description of the Related Art

In nanoimprint lithography, some feedback based methods are known for improving thermal control to improve overlay control accuracy and overlay control stability. However, feedback based approaches typically have a very high time constant and consequently a very low closed-loop control bandwidth. This significantly limits the thermal control performance of conventional nanoimprint lithography, and consequently both overlay control accuracy and overlay control stability suffer.

SUMMARY OF THE INVENTION

According to a first aspect of the present invention, a thermal frame of an imprinting apparatus has a motor and a cooling element. A metrology frame of the imprinting apparatus is coupled to an output end of the motor and receives an imprinting mold. Thermal isolation is provided between the motor and the metrology frame. Thermal sensors are disposed at locations of the frames. A digital controller applies a control signal for controlling a driving signal (e.g. driving current or driving voltage) of the cooling element to maintain a thermal balance, such as thermal equilibrium, of heat flow between the frames. The digital controller uses output of the thermal sensors to calculate transfer functions of heat flow used to calculate the control signal. The feedforward design avoids the very low control bandwidth that limits the performance of typical feedback designs.

According to a second aspect of the present invention, an imprint apparatus includes a first frame having at least one motor and at least one cooling element, a second frame coupled to an output end of the motor and having a surface configured to attach an imprinting mold, a plurality of thermal sensors disposed at locations of the first frame and the second frame; and a digital controller that is configured to apply a control signal for controlling a driving signal of the at least one cooling element to maintain a thermal balance of heat flow from the first frame to the second frame. The digital controller calculates the control signal using output of the plurality of thermal sensors to calculate a first transfer function of estimated heat flow provided by the motor between the first frame and the second frame and calculate an inverse of a second transfer function of estimated heat flow of the cooling element between the first frame and the second frame. Moreover, the digital controller calculates the control signal by running the value of a current, which flows through and/or powers the motor, (also referred to as drive current) through both the first transfer function and the inverse of the second transfer function to provide a value of the cooling current to be provided to the at least one cooling element to maintain the thermal balance. At least one of the first transfer function and the second transfer function is used to calculate the control signal. Related control and manufacturing methods are also disclosed.

Further features of aspects of the present invention will become apparent from the following description of exemplary embodiments with reference to the attached drawings.

DESCRIPTION OF THE EMBODIMENTS

In imprint lithography, to provide sufficient overlay accuracy, precise control of the force applied by an imprint head (zhead) is needed. Force control accuracy and force control bandwidth directly affect overlay control accuracy and imprint throughput. For example, to provide 6 nm overlay accuracy, about 0.1 N of force control accuracy on the imprinting medium is needed. High stiffness of the imprint head is also needed for the overlay control. The need for high stiffness in the imprint head limits the potential usefulness of a load cell(s) or other force sensor(s) to measure force directly due to the compliance of the force sensor(s). That is, the imprint head and the force sensor(s) would essentially act as a combined unit with respect to the absorption of force and precision of overlay control, making it difficult to precisely control the amount of force applied by just the imprint head itself, and thus limiting the overlay accuracy. Consequently, although force sensors can be used in imprint lithography, their usefulness is limited to relatively large dimension processes, and for example is of limited value in nanoimprint lithography.

A preferable alternative to the use of a force sensor(s), especially in nanoimprint lithography, is to control precisely the relative amount of force applied to the imprint head (zhead) during the imprint process when the imprint mask is applied to an imprinting medium disposed on a substrate compared to the amount of force needed to move the imprint head (zhead) in free space without contacting an imprinting medium or other solid or liquid form. The amount of force needed to move the imprint head (zhead) in free space can be precisely calibrated. Accordingly, control of the relative amount of force compared to the precisely calibrated value of force for movement in free space provides a good indication of the total amount of force being applied during the imprinting process. This system and method of measuring imprinting force is also useful because the force can be specified in terms of the relative amount of current supplied to the motor during the imprinting processes compared to a precisely calibrated amount of current applied to move the imprint head in free space.

Figure 1:
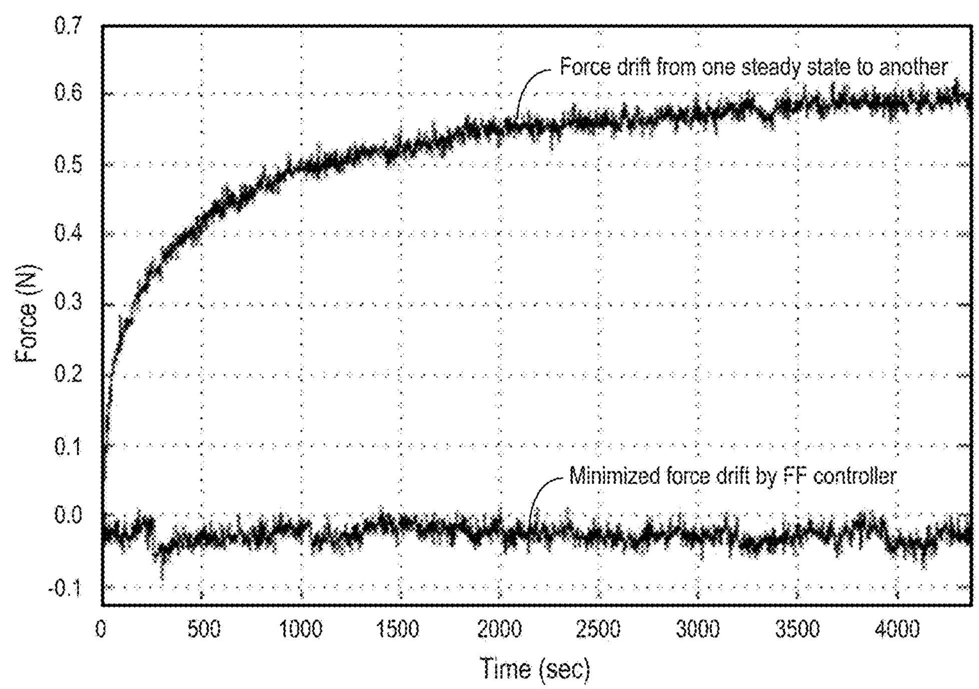
FIG. 1 illustrates both uncontrolled thermally induced zero point drift in a conventional imprinting apparatus and minimization of such zero point drift in accordance with an aspect of the present invention.

Unfortunately, distortion caused by temperature variation(s) and temperature gradient(s) in a metrology frame of the imprint apparatus typically has a deleterious impact on force measurement accuracy and thus overlay control accuracy. Referring now to FIG. 1, for example, the top graphed portion shows that heat transferred from a thermal source such as the motor (especially the voice coil of the motor) deleteriously impacts the performance of the means of providing measured values (whether the means be sensors or relative current measurement), resulting in zero drift in measured force values. Usually the metrology frame M and the thermal frame T are made of large metal components, and the thermal time constant I is on the order of several hundred seconds (as can be seen, for example, in the top graphed portion of FIG. 1) due to thermal resistance and capacitance of the components. Conventionally, a feedback based control technique is applied to reduce the distortion. However, such feedback control techniques may perform poorly due to the large value (several hundred seconds) of the thermal time constant I, and thus the very low closed loop bandwidth of feedback based control.

Figure 2:
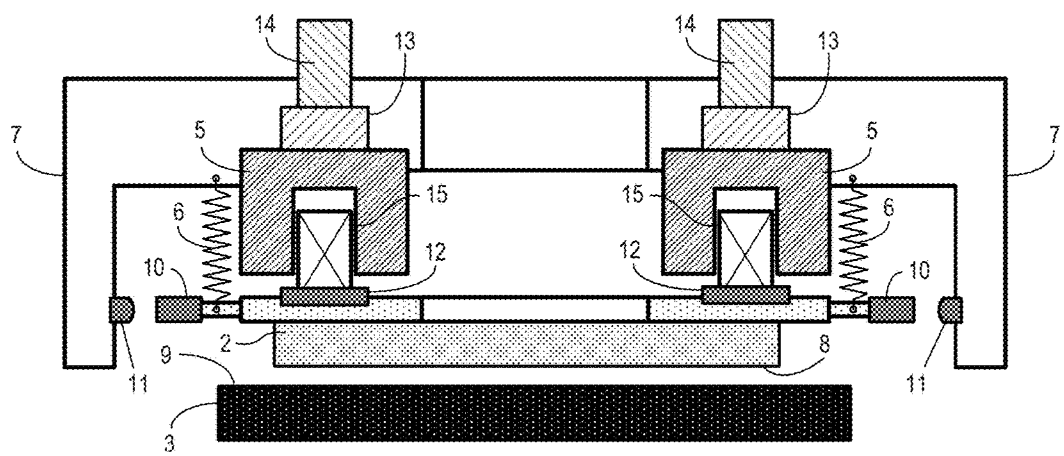
FIG. 2 illustrates an example of an imprint apparatus in accordance with an embodiment of the present invention.

Referring now to FIG. 2, there is shown an example of an imprint apparatus in accordance with an embodiment of the present invention. The imprint apparatus includes a metrology frame M and a thermal frame T. The metrology frame includes a moving body 2, a plurality of position scales 10, a plurality of position sensor heads 11 respectively corresponding to the position scales 10, a plurality of springs 6, and a rigid fixed support body 7. The position scales 10 and position sensor heads 11 may be used to provide fine control over imprinting operations. The thermal frame includes a plurality of voice coils 15, a plurality of magnets 5 respectively corresponding to the voice coils 15, a plurality of electronic coolers 13 respectively corresponding to the voice coils 15, and a plurality of heat sinks 14 respectively corresponding to the plurality of voice coils. The magnets 5 are usually permanent magnets but can alternatively be another type such as electro-magnets. The electronic coolers 13 can be, for example, thermoelectric coolers (TEC) or alternatively vortex coolers, and may be either current driven or voltage driven. The voice coils 15 act as actuators (and thus may be referred to as voice-coil actuators) that provide downward force for performing an imprinting operation. In particular, current is applied to each of the voice coils 15, which causes the voice coils 15 to produce respective magnetic fields, the produced respective magnetic fields interact with respective magnetic fields B of the respective magnets 5 to produce the downward force which is applied to the moving body 2 to perform an imprinting operation. The moving body 2 includes an imprinting mold chuck 8 or other means of affixing an imprinting mold to the underside of the moving body 2. To perform an imprinting operation, an imprinting medium (such as a liquid resin) is disposed on a top surface of a substrate 9 which is held in place by a chuck of a substrate positioning stage 3 disposed in a base (not shown) of the imprint apparatus. The substrate positioning stage 3 supports controlled movement of the substrate 9 horizontally (for example, between imprinting operations) to allow the imprinting mold to be aligned to each imprint field (also referred to as a pattern area or a shot area) of the substrate 9. The substrate 9 may include a plurality of imprint fields, for example, disposed in a two-dimensional grid pattern. A suitably polarized electric current is then applied to the voice coils 15 to cause the voice coils 15 to apply a downward force on the moving body 2 which brings a patterning surface of the imprinting mold into contact with the imprinting medium on an imprint field. By virtue of the contact, the imprinting medium is drawn by capillary action into features of the patterning surface of the imprinting mold. This processing can be repeated for a plurality of imprint fields disposed adjacent one another horizontally on the substrate 9. This processing also can be repeated for a plurality of imprint fields disposed vertically to one another, for example, to form multilayer devices. Alternatively, the patterning surface of the imprinting mold can be featureless and preferably either the same size or larger than the substrate 9, for example flat, and when featureless can be used, for example, to perform planarization of an upper surface of the imprinting medium. As another alternative, the downward force can be used to press the imprinting mold into the imprinting medium, either for imprinting features of the patterning surface of the imprinting mold into the imprinting medium or alternatively for performing planarization of the upper surface of the imprinting medium. Prior to the imprinting operation, the imprinting medium can be applied to all or a portion of the region to be imprinted for example as a plurality or multitude of droplets (also referred to a drop dispensed). Alternatively, prior to the imprinting operation, the imprinting medium can be applied to the region to be imprinted (or all or most of the upper surface of the substrate 9) using spin coating, dip coating, spray coating, or other coating technique. The position of the moving body 2 along the position scales 10 may be used to provide an indication and/or verification of the current being supplied to the voice coils 15 during that portion of the imprinting operation in which imprinting mold is not in contact with the imprinting medium disposed on the top surface of the substrate 9, for example, prior to the imprinting mold making contact with the imprinting medium disposed on the top surface of the substrate 9. In particular, a relationship between the amount of current being supplied to the voice coils 15 and the position of the moving body 2 is typically stable and accordingly can be mapped-out and stored in the look-up table (LUT) prior to imprinting operations. Thus, the amount of current being supplied to the voice coils 15 during an imprinting operation can be determined by reading the position of the moving body 2 from a position signal supplied by the position sensor heads 11, and then looking-up the current value in the LUT that corresponds to the read position of the moving body 2. Moreover, for example, in a case where the amount of current is changed by a disturbance to the imprinting apparatus, the position readings may be used to reduce the impact of the change. Special imprinting operations are not needed to implement the thermal control provided by the present invention. Conventional imprinting operations can be used. Accordingly, further detail regarding the actual imprinting operations are not necessary to understand the nature of the thermal control provided by the present invention, and so further discussion thereof is omitted.

The metrology frame M is preferably thermally isolated from the thermal frame T by a plurality of thermal isolators 12 composed of a rigid thermal insulator such as the titanium alloy Ti-6Al-4V. Other materials, such as other alpha-beta stabilized Titanium alloy thermal insulators, may alternatively be used. Many of the components of the metrology frame M and the thermal frame T are made of mostly of metal. For example, the moving body 2, springs 6, and rigid fixed support body 7 of the metrology frame are made of metal for its strength and stiffness. The voice coils 15 and magnets 5 of the thermal frame are made of metal for its electrical conductance and magnetic properties respectively. Due to the mass of metal used to provide sufficient strength and stiffness, and the relatively large heat resistance (due to the shapes of the metal components for stiffness purposes) and especially the large heat capacitance due to the large mass of the imprint apparatus, the thermal time constant I of the imprint apparatus is on the order of several hundred seconds (as can be inferred from to top graphed portion shown in FIG. 1) due to thermal resistance and thermal capacitance of the metal components, which would significantly degrade feedback based control performance due to very low closed loop bandwidth. For example, the closed loop bandwidth (3 dB point) could be estimated as roughly ½πτ which is roughly $3\times10^{-4}$ Hz. This low closed loop bandwidth can be too low to provide sufficiently precise control of the force to be applied by the imprint head (zhead) during imprinting process, especially for nanoscale processes.

Figure 3A:
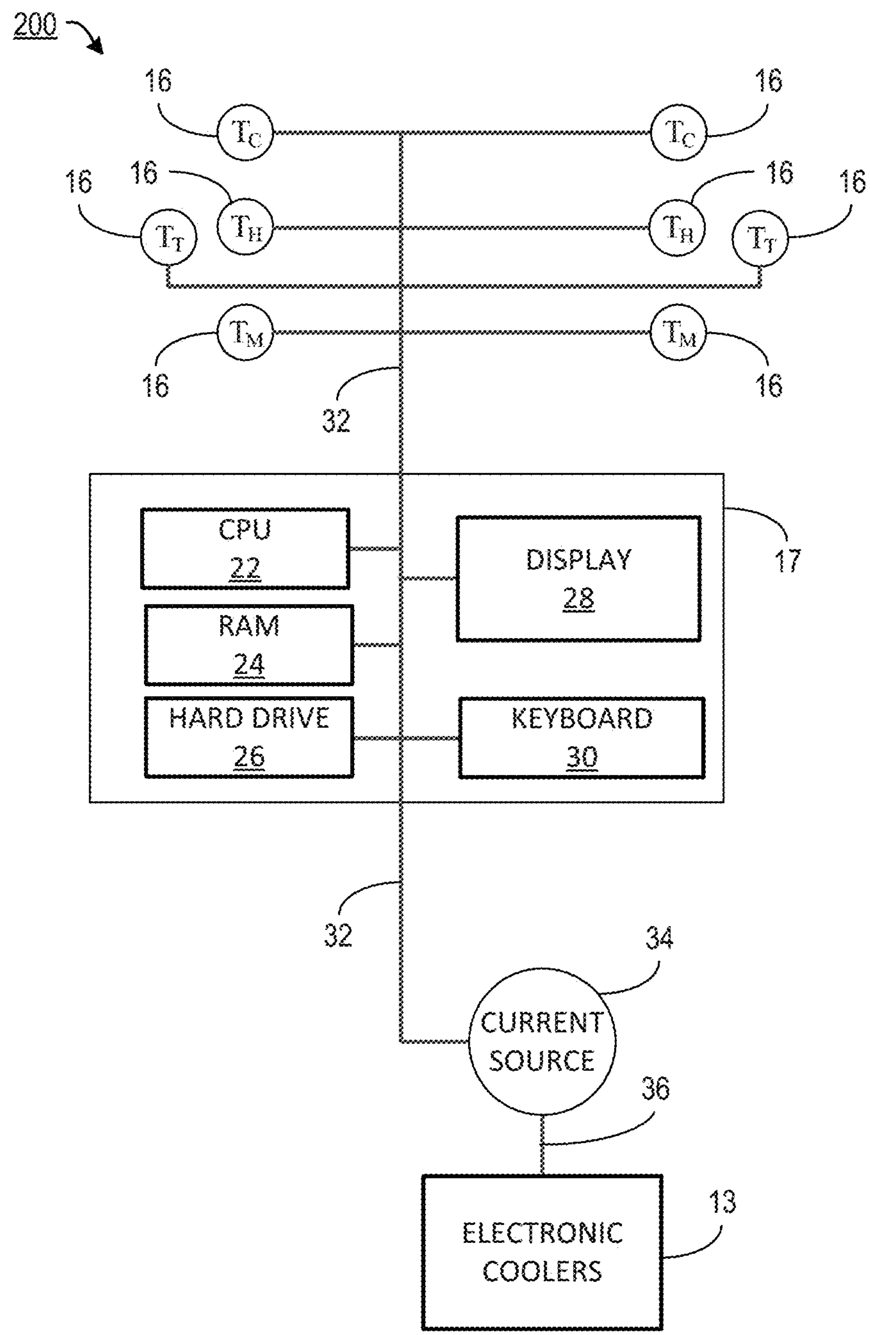
FIG. 3A is a schematic diagram of a thermal control system of an imprint apparatus in accordance with an embodiment of the present invention.
Figure 3B:
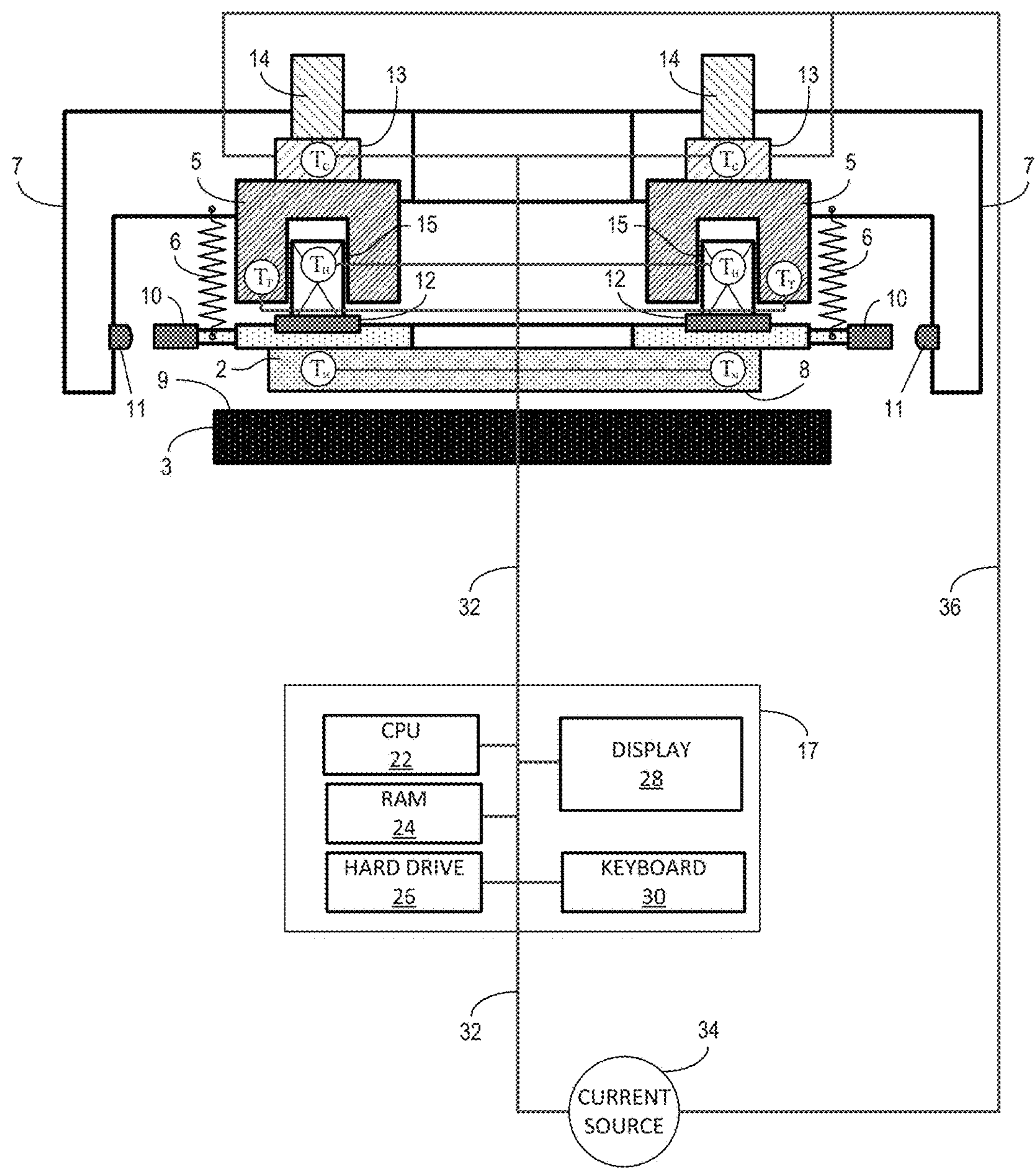
FIG. 3B a schematic diagram of a thermal control system as incorporated into the imprint apparatus in accordance with an embodiment of the present embodiment.

Referring now to FIGS. 3A and 3B, there are shown schematic diagrams of a thermal control system 200 of an imprint apparatus 100 according to a first embodiment of the present invention. FIG. 3A shows the components of the thermal control system 200 in isolation, whereas FIG. 3B shows the thermal control system 200 as incorporated into the imprint apparatus in accordance with the present embodiment. The thermal control system 200 includes a plurality of thermal sensors 16 and a digital controller 17. The thermal sensors 16 are disposed at various positions of the metrology frame M and the thermal frame T. For example, the thermal sensors 16 can be incorporated into or affixed to the respective components whose temperatures are measured. In this embodiment, on the metrology frame M, the thermal sensors 16 are disposed at the moving body 2 preferably underneath the voice coils 15 and/or adjacent to the region underneath the voice coils 15, whereas on the thermal frame T, the thermal sensors 16 are disposed at the voice coils 15, the magnets 5, and the electronic coolers 13. Thermal sensors 16 may be attached to or incorporated into the voice coils 15 and/or the magnets 5. One or more thermal sensors 16 may be attached to the outside of the voice coils 15 or to a top surface of the voice coils 15. A voice-coil actuator, which includes a voice coil 5 and may additionally include one or more thermal sensors 16, typically is an analog device, with two leads for supplying a driving current to the voice coil 15, and if the thermal sensor 16 is included, with three leads for the thermal sensor 16. In an alternative embodiment, one or more of those thermal sensors 16 disposed at the voice coils 15 are integrated into the voice coils 15, for example, by being encapsulated with the voice coils 15. Alternatively, one or more of the thermal sensors 16 may be electrically integrated with the voice coils 15 and signals (for example, digital signals) supplied to and from the thermal sensors 16 may be carried by the same conductive lines that power the voice coils 15. Moreover, both encapsulation and electrical integration can be included. Each of the thermal sensors 16 measures the temperature of the component at which it is disposed, converts the measurement to a digital signal, and supplies the digital signal periodically to the digital controller 17. Each of the thermal sensors 16 can be implemented, for example, using a conventional thermistor or a conventional thermocouple. The digital controller 17 includes a central processing unit (CPU) 22, a random access memory (RAM) 24, a hard drive 26, a display unit 28, and a keyboard 30, which are interconnected by a bus 32. The hard drive 26 stores an operating system for operating the various components of the digital controller 17. The digital controller 17 is thus a computer, and moreover, can be implemented using a personal computer if programmed to implement the feedforward thermal control method discussed below. The hard drive 26 also stores a program of instructions for implementing an embodiment or embodiments of the feedforward thermal control method in accordance with the present invention, as discussed in detail below. For improved performance, the thermal control system 200 preferably also includes the plurality of thermal isolators 12, for example, as shown in FIG. 3B. The thermal isolators 12 provide heat isolation of the metrology frame M from the thermal frame T, and are beneficial for improving performance of the thermal control program by assisting in reducing heat flow from the thermal frame T to the metrology frame M. The thermal isolators 12 preferably are located directly beneath the voice coils 15 to impede flow of heat from the voice coils into the metrology frame M. Also shown (see FIG. 3A) is a current source 34 connected to the bus 32. The digital controller 17 performs the feedforward thermal control method to determine the control signal, sends the control signal via the bus 32 to the current source 34, which causes the current source 34 to supply the appropriate valued driving current $I_C(t)$ via conductive lines 36 to the electric coolers 13 in accordance with the present embodiment.

Figure 3C:
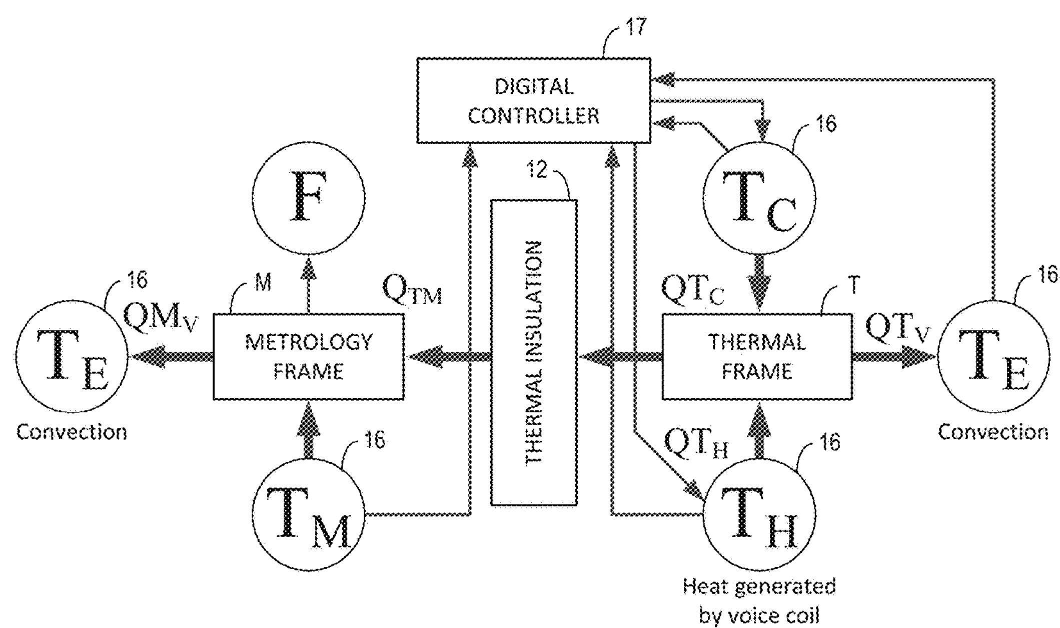
FIG. 3C is a schematic flow diagram of the thermal control system in accordance with an embodiment of the present invention.

Referring now also to FIG. 3C, there is shown a schematic flow diagram of the thermal control system 200 also showing heat flow between the thermal frame T and the metrology frame M, typically from the thermal frame T to the metrology frame M. For explanatory purposes, in FIG. 3C, a single thermal isolator 12 is shown, as each of the thermal isolators 12 performs in like manner. The lines from the thermal sensors $T_M$ 16, $T_C$ 16, and $T_H$ 16 to the digital controller 17 represent the provision of temperature information to the digital controller 17. The line from the digital controller 17 to the thermal sensor $T_C$ 16 represents the electrical control of the cooling of the thermal frame T provided by the electronic coolers 13 to which the thermal sensor $T_C$ 16 are disposed. The line from the digital controller 17 to the thermal sensor $T_C$ 16 represents the electrical control of the heating of the thermal frame T provided by the voice coils 15 to which the thermal sensor $T_H$ 16 are disposed. The flow of heat is shown using the thicker lines in the illustration. Technically, heat flows from the thermal frame T to the electronic coolers 13, but such is illustrated in FIG. 3C with an arrow pointing to the thermal frame T to emphasize that the coolers 13 are used to provide a cooling effect to the thermal frame T. The thicker line from thermal sensor $T_M$ 16 to the metrology frame M illustrates the control of the temperature of the metrology frame M provided by the embodiment using various expressions provided below. The element F represents the force applied by an imprinting operation, and although dependent on the current in the voice coils 15 and the position of the moving body 2 along the position scales 10, this force is also dependent on the temperature control of the imprinting apparatus. The thicker line from the thermal sensor $T_M$ 16 to the metrology frame M represents the control of the temperature of the metrology frame M provided by the present embodiment using various expressions provided below.

Metrology frame temperature control accuracy (the difference relative to the surrounding controlled environment temperature) and stability (uniformity across the metrology frame) mainly depends on a dynamic heat transfer balance $\Delta Q_M(t)$, which is the difference between heat transferred into and heat transferred out of metrology frame M. In accordance with the present embodiment, the dynamic heat transfer balance $\Delta Q_M(t)$ is modelled in accordance with Expression 1 (Ex. 1) provided below, $$\Delta Q_M(t) = QM_V(t) - Q_{TM} = QM(t) - \frac{T_T(t) - T_M(t)}{R_{TM}}, \quad \text{(Ex. 1)}$$

where $QM_V(t)$ denotes heat transferred from the metrology frame M to the surrounding controlled air environment, $Q_{TM}(t)$ denotes heat transferred from the thermal frame T to metrology frame M, $T_T(t)$ denotes the temperature of thermal frame T, $T_M(t)$ denotes the temperature of metrology frame M, and $R_{TM}$ denotes the heat transfer resistance between the thermal frame T and the metrology frame M. Most of the heat transfer is due to convection, although radiant heating provides a portion of the heat transfer, for example, into the environment E. In this embodiment, the temperature of thermal frame $T_T(t)$ is determined as an average of the temperature $T_H(t)$ of the motor (composed of magnets 5 and voice coils 15) and the temperature $T_C(t)$ of the electronic coolers 13. In an alternative embodiment, the temperature of thermal frame $T_T(t)$ is determined, for example, as the temperature of the magnets 5.

In accordance with an aspect of the present invention, the zeroth law of thermal dynamics is exploited to provide high accuracy metrology frame temperature control by maintaining the thermodynamics close to a steady state. This is implemented in the present embodiment by minimizing net heat flow to (the difference between the magnitude of heat flow into and the magnitude of heat flow out of) the metrology frame M as close to zero as possible, that is $Q_{TM}(t)+QM_V(t)$ is maintained near to zero. The following three components may be used to implement this. First component—the temperature of thermal frame $T_T(t)$ is monitored by the digital controller 17 along with the temperature $T_H(t)$ of the motor, and responsive thereto, the temperature of the electronic coolers 13 is adjusted (as discussed below) to maintain suitably minimal variation in the temperature of thermal frame $T_T(t)$. Second component—the heat $Q_{TM}(t)$ transferred from the thermal frame T to the metrology frame M is minimized, which can be achieved by minimizing the temperature difference $T_T(t)-T_M(t)$ between metrology frame M and thermal frame T. More particularity, in this embodiment, the heat $Q_{TM}(t)$ is minimized by both: (1) applying a feedforward control of the temperature (cooling) applied by the electronic coolers 13 (as discussed in detail below), and (2) maximizing the thermal resistance between thermal frame T and metrology frame M by using high quality thermal isolators 12 which are both sufficiently stiff to support accurate overlay control and also have high heat resistivity to reduce the flow of heat from the thermal frame T to the metrology frame M. In an alternative embodiment, lower quality of thermal isolators 12 may be used, or alternatively thermal isolators that are stiffer but that have less heat resistivity may be used, but then greater reliance is made on the aforementioned feedforward control. Third component—minimize the temperature difference $T_M(t)-T_E(t)$ between and temperature of metrology frame M and the surrounding environment, and maintain a controlled temperature in the surrounding controlled environment using an environmental control unit (ECU) comprising a highly monitored air conditioning system. In accordance with an aspect of the present embodiment, the zeroth law of thermodynamics, the maintained minimal variation in the temperature of thermal frame $T_T(t)$, the minimized heat $Q_{TM}(t)$ transferred from the thermal frame T to metrology frame M, and the minimize the temperature difference $T_M(t)-T_E(t)$ between and temperature of metrology frame M and the surrounding environment, provide in accordance with the zeroth law of thermodynamics that the temperature of the thermal frame $T_T(t)$ is maintained in steady state equilibrium with the temperature of the surrounding controlled environment.

However, both the first component and the second component discussed above utilize controlling the temperature applied by the electronic coolers 13. Accordingly, it is highly valuable that the control implemented by the first component and the control implemented second component do not to conflict with one another, and moreover, do not conflict with the third component of minimizing the temperature difference $T_M(t)-T_E(t)$ between and temperature of metrology frame M and the surrounding environment. In accordance with an aspect of the present invention, a feedforward control system and method is provided for controlling the temperature applied by the electronic coolers 13 that can simultaneously implement the three components discussed above so as to exploit properties of the zeroth law of thermodynamics and maintain the imprint apparatus in steady state thermal equilibrium with the surrounding controlled environment provided using the environmental control unit (ECU). Beneficially, the thermal frame T, the metrology frame M, and the thermal isolators 12 can each be maintained in steady state thermal equilibrium with the surrounding controlled environment. Moreover, the feedforward control thus provides a thermal coupling of the temperature the imprint apparatus (including the thermal frame T, the metrology frame M, and the thermal isolators 12) to the surrounding controlled environment temperature provided by the ECU to prevent variations in the temperature difference relative to the surrounding controlled environment temperature and stability across the metrology frame. The thermal coupling improves performance of the thermal control system by maintaining thermal equilibrium with the surrounding controlled environment which itself is being maintained at controlled temperature, and thus the thermal control system of the imprint apparatus cooperates with the ECU rather than fighting against the ECU.

In accordance with an aspect of the present embodiment, the heat transfer of thermal frame T and the metrology frame M can be modelled based on the Newton's cooling law and the energy conservation law according to Expression 2 (Ex. 2) provided below:

$$\frac{dQ(t)}{dt} = -hA_T(T_T(t) - T_{ENV}) - \frac{T_T(t) - T_M(t)}{R_{TM}}, \quad \text{(Ex. 2)}$$

wherein Q denotes heat generated by the voice coils 15 and removed by electronic coolers 13, $C_T$ denotes heat capacitance of the thermal frame T, h denotes the heat transfer coefficient between thermal/metrology frames T, M and the surrounding air, $A_T$ denotes heat transfer surface area between the thermal frame T and the surrounding air, and $T_{ENV}$ denotes the temperature of the surrounding air of the surrounding controlled environment provided by the ECU.

In accordance with the present embodiment, the thermal frame T and the metrology frame M are treated together as a lumped capacitance thermal energy reservoir with a total thermal energy content Q which is proportional to the simple total heat capacity C and the temperature T of the reservoir. Accordingly, as the simple total heat capacity C is constant, it follows that:

$$C\frac{dT(t)}{dt} = \frac{dQ(t)}{dt}, \tag{Ex. 3}$$

and accordingly that:

$$C_T\frac{dT_T(t)}{dt} = -hA_T(T_T(t) - T_{ENV}) - \frac{T_T(t) - T_M(t)}{R_{TM}}. \tag{Ex. 4}$$

In accordance with the present embodiment, the metrology frame M is modelled in a similar manner as:

$$C_M\frac{dT_M(t)}{dt} = hA_M(T_M(t) - T_{ENV}) - \frac{T_T(t) - T_M(t)}{R_{TM}}, \tag{Ex. 5}$$

wherein $C_M$ denotes the heat capacitance of metrology frame M, and $A_M$ denotes the heat transfer surface area between the metrology frame M and the surrounding air of the surrounding controlled environment provided by the ECU.

In accordance with the modelling of the present embodiment, transfer functions are obtained in a complex frequency domain s (hereinafter s-domain), for example, by taking the Laplace Transform. In accordance with the modelling, the temperature transfer function H(s) from the thermal frame T to the metrology frame M is given by Expression 6 (Ex. 6) provided below:

$$H(s) = \frac{T_M(s)}{T_T(s)} = \frac{\frac{R_{TM}C_T}{A_T}s + \left(\frac{1}{A_M} + \frac{1}{R_{TM}A_T} + h\right)}{\frac{C_M R_{TM}}{A_M}s + \left(\frac{1}{A_M} + \frac{1}{A_T} + h\right)}. \tag{Ex. 6}$$

One of ordinary skill in the art will appreciate that a capital letter T is used to represent the temperature T(t) and T(s) in the time t-domain and spectral s-domains respectively.

Furthermore, transforming Expression 3 into the complex frequency domain yields Expression 7 (Ex. 7) provided below:

$$CT(s)=Q(s). \tag{Ex. 7}$$

As an alternative embodiment, applying Expression 7 to Expression 6, yields an alternative formulation Expression 8 (Ex. 8) of a temperature transfer function H(s) from the thermal frame T to the metrology frame M:

$$H(s) = \frac{T_M(s)}{Q(s)} = \frac{\frac{R_{TM}C_T}{A_T}s + \left(\frac{1}{A_M} + \frac{1}{R_{TM}A_T} + h\right)}{\frac{C_T C_M R_{TM}}{A_M}s + C_T\left(\frac{1}{A_M} + \frac{1}{A_T} + h\right)}. \tag{Ex. 8}$$

In accordance with the present embodiment, a thermal actuator dynamic which represents the heat generated by the voice coils 15 that is removed from the thermal frame T, and the heat (cooling effect) generated by the electronic coolers 13 that is removed from the thermal frame T, and other un-modelled dynamics, can be modelled by respective by actuator transfer functions $A_H(s)$ and $A_C(s)$ as shown by Expressions 9 and 10 provided below:

$$A_H(s) = \frac{Q_H(s)}{I_H(s)}, \tag{Ex. 9}$$

and $$A_C(s) = \frac{Q_C(s)}{I_C(s)}, \tag{Ex. 10}$$

wherein $I_H(s)$ denotes the current (or in an alternative embodiment the voltage) injected into voice coil (heat actuator), and $I_C(s)$ denotes the current (or in an alternative embodiment the voltage) injected into the electronic coolers 13 (cooling actuator). In accordance with the present embodiment, at least for TEC based electronic coolers 13, Expression 10 for $A_C(s)$ can beneficially be simplified to a scaling factor without significant loss in force control accuracy. Similarly, in accordance with the present embodiment, the voice coils 15, using non-linear mapping, Expression 9 the $A_H(s)$ can beneficially be simplified to scaling factor without loss in force control accuracy. One of ordinary skill in the art will appreciate that a capital letter I is used to represent the current I(t) and I(s) in the time t-domain and spectral s-domains respectively.

Furthermore, in accordance with the present embodiment, applying Expressions 9 and 10 allows the heating of the voice coils 15 and electronic coolers 13 respectively to be separately modelled. In particular, the transfer function $I_H(s)$ from the voice coils 15 (heating actuator) to the metrology frame M, and the transfer function $H_C(s)$ from the electronic coolers 13 to the metrology frame M, can respectively be modelled as Expressions 11 and 12 provided below:

$$H_H(s) = \frac{T_M(s)}{I_H(s)} = A_H(s)\frac{\frac{R_{TM}}{A_T}s + \left(\frac{1}{A_M} + \frac{1}{R_{TM}A_T} + h\right)}{\frac{C_T C_M R_{TM}}{A_M}s + C_T\left(\frac{1}{A_M} + \frac{1}{A_T} + h\right)}, \text{ and} \tag{Ex. 11}$$

$$H_C(s) = \frac{T_M(s)}{I_C(s)} = A_C(s)\frac{\frac{R_{TM}}{A_T}s + \left(\frac{1}{A_M} + \frac{1}{R_{TM}A_T} + h\right)}{\frac{C_T C_M R_{TM}}{A_M}s + C_T\left(\frac{1}{A_M} + \frac{1}{A_T} + h\right)}. \tag{Ex. 12}$$

Based on Expressions 11 and 12, the complex spectrum of the appropriate value of current $I_C(s)$ to be applied to the electronic coolers 13 to maintain the imprint apparatus at or very near thermal equilibrium can be modelled as a function of the transfer functions $H_H(s)$ and $H_C(s)$ and the complex spectrum of the temperature $T_M(s)$ and $T_T(s)$ of the metrology frame M and the thermal frame T respectively. Technically the complex spectrums of the temperatures $T_M(s)$ and $T_T(s)$ are values based on the entire time from t=0 to t=∞. According to another aspect of the present embodiment, as future values of the temperature temperatures $T_M(t)$ and $T_T(t)$ are not technically known, the values of the complex spectrums $T_M(s)$ and $T_T(s)$ can be determined, for example, by making sufficiently accurate estimates. In accordance with an aspect of the present invention, the complex spectrums $T_M(s)$ and $T_T(s)$ can be obtained by sampling the time values $T_M(t)$ and $T_T(t)$ at a periodic rate (for example at 10 KHz).

In accordance with an aspect of the present embodiment, the transfer functions $H_H(s)$ and $H_C(s)$ can be treated as dynamic modelling functions in the s-domain. That is, the digital controller 17 can periodically or occasionally re-identify or revise the transfer functions $H_H(s)$ and $H_C(s)$ to update the modelling, for example, to account for minor variations in the imprinting force. Such re-identification or revision may be performed, for example, a few times per year and/or upon system installation and/or updating. Variations in the imprinting force can be determined, for example, by comparing, at various positions of each position sensor head 11 along its respective position scale 10, the actual current used in imprint operations prior to the imprinting mold making contact with the imprinting medium with the calibrated current predicted by the modelling described herein.

Once transfer functions, (or such re-identified or revised transfer functions), $H_H(s)$ and $H_C(s)$ are obtained, they can be transformed by the digital controller 17 into the time domain, for example by computing an inverse Laplace Transform, to obtain corresponding impulse response functions $h_C(t)$ or $h_H(t)$ which are functions of time t. Moreover, once the corresponding impulse response functions $h_C(t)$ or $h_H(t)$ are obtained, and a value of the temperature $T_T(t)$ of the thermal frame can be predicted using convolution in the continuous time domain, for example, as follows:

$$T_T(t) = I_H(t) * h_C(t) = \int_{-\infty}^{t} I_H(\tau) h_C(t-\tau) d\tau, \quad \text{(Ex. 13)}$$

wherein τ is a real valued dummy variable of integration. In an alternative embodiment, modelling can be performed in a discrete time domain, for example, as follows:

$$T_T[n] = I_H[n] * h_C[n] = \sum_{k=0}^{N} I_H[k] h_C[n-k], \quad \text{(Ex. 14)}$$

where k is an integer valued dummy variable of summation, and wherein N represents a current value of time t as a discrete variable. In an alternative embodiment, the s-domain representations $T_T(s)$ is transformed by the digital controller 17 to a z-domain representation, (z being a complex variable), used to represent the spectrum of a discrete time [n] variable, for example, by computing a bilinear transformation of $T_T(s)$ to obtain a z-domain representation $T_T(Z)$. Once $T_T(Z)$ is obtained, the digital controller 17 can compute an inverse z-transform to obtain discrete representation values $T_T[n]$ directly without sampling the continuous time representation $T_T(t)$. Alternatively, a discrete frequency domain may be used in conjunction with the Discrete Fourier Transform (DFT) and/or the Fast Fourier Transform (FFT).

In accordance with the present embodiment, suitably accurate values for the transfer functions $H_H(s)$ and $H_C(s)$ can be identified by using system identification. System identification applies signal processing methods to build mathematical models of dynamical systems from measured data. For example, a system is excited by an exciting signal and the output from the system is measured by sensors. There are lot of options regarding by exciting signal and signal processing methods. The present invention is not limited to a particular method or system for estimating the transfer functions $H_H(s)$ and $H_C(s)$.

Figure 4:
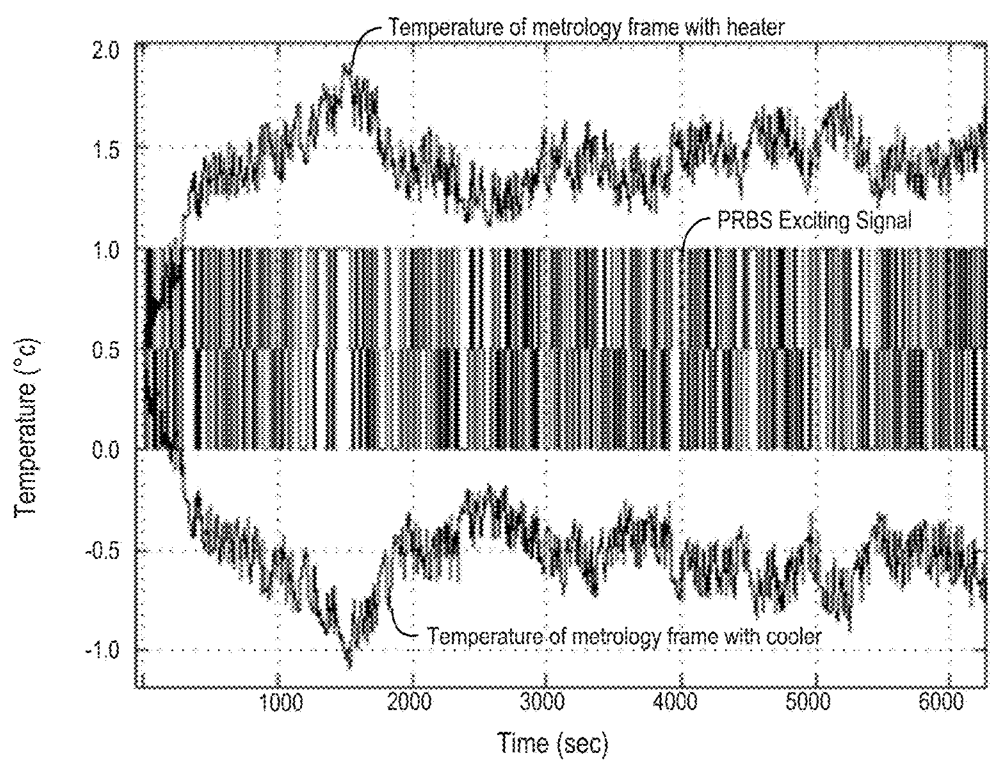
FIG. 4 illustrates aspects of a specific method of obtaining suitably accurate values for transfer function $H_H(s)$ and $H_C(s)$ in accordance with an embodiment of the present invention.

Nonetheless, referring now also to FIG. 4, specific methods of obtaining suitably accurate values for the transfer functions $H_H(s)$ and $H_C(s)$ that are highly useful are illustrated. In FIG. 4, voice coils 15 are excited using a pseudo-random binary signal (PRBS) for the applied temperature $T_H(t)$, and the resulting temperature $T_M(t)$ is measured and mapped over time in the metrology frame M and is labeled "Temperature of metrology frame with heater" For example, a periodic pseudo-random binary signal (PRBS) can be used as the excitation. Also in FIG. 4, at a separate time from the measurements for $T_H(t)$, electronic coolers 13 are excited using a pseudo-random binary signal (PRBS) for the applied temperature $T_C(t)$, and the resulting temperature $T_M(t)$ is measured and mapped over time in the metrology frame M and is labeled "Temperature of metrology frame with cooler". Again, for example, a periodic pseudo-random binary signal (PRBS) can be used as the excitation. In FIG. 4, the PRBS are the respective square wave like signals (with pseudo-random duty cycle) which jump between 0 and 1 in value, and which are shown in the middle of FIG. 4. The measured resulting respective temperatures $T_M(t)$ are the other graphed waveforms in FIG. 4. A PRBS is deterministic, and it is spectrally white. Moreover, a PRBS has an optimal crest factor (typically for a PRBS, the crest factor is between about 5 and 7) which results in a large total energy delivery into the excited system. A transfer function can be found using a subspace identification method using PRBS input signal and output measured by metrology frame M and thermal frame T thermal sensors directly, or indirectly measured force drift.

Figure 5:
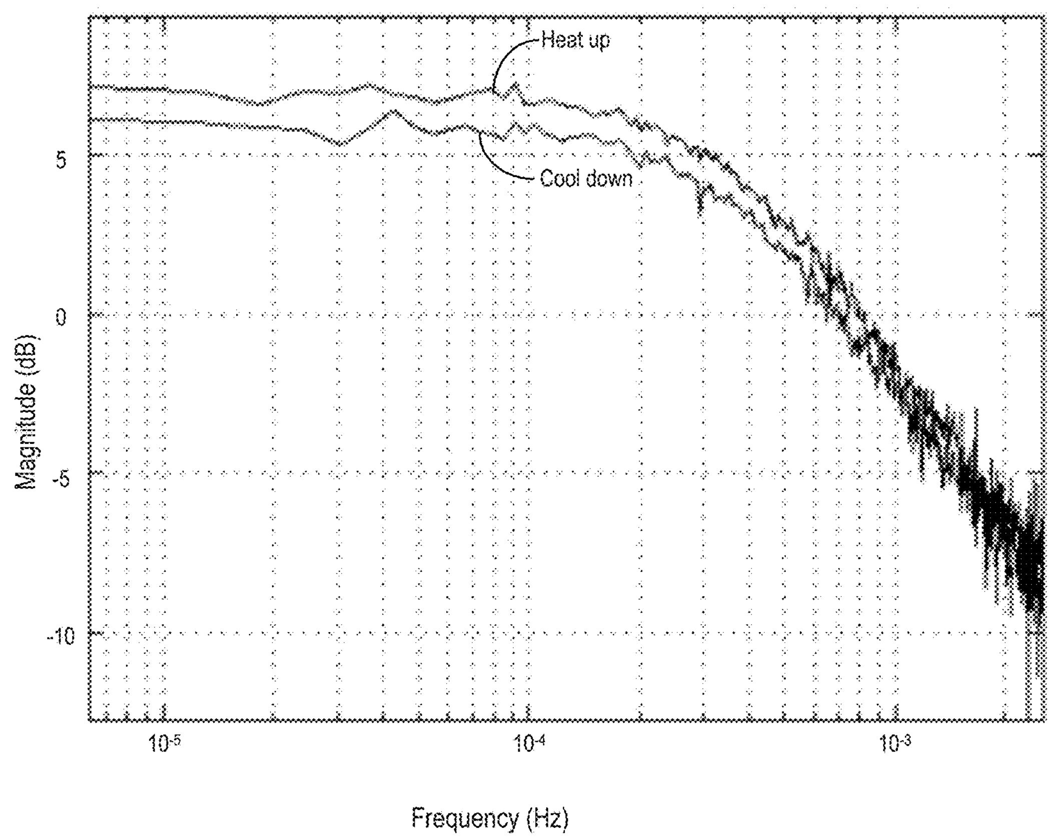
FIG. 5 illustrates an example of a spectrums identified using system identification based on a PRBS exciting signals $T_H(t)$ and $T_C(t)$ a measured resulting temperatures $T_M(t)$ over time in a metrology frame M, in accordance with an embodiment of the present invention.

Referring now also to FIG. 5, there is shown an example of the spectrum "Heat up" identified using system identification based on the PRBS exciting signal $T_H(t)$ and measured resulting temperature $T_M(t)$ over time in the metrology frame M. The system identification graph of $H_H(s)$ in this example is limited to that portion of the complex spectrum $H_H(s)$ that lies on the imaginary axis in the s-domain. That is if $s=\sigma+j\overline{\omega}$, with σ and $\overline{\omega}$ being real values, and with j representing the positive square root of −1, then s in the determined system identification graph of $H_H(s)$ is that is for that portion of s wherein σ=0, that is the amplitude of $H_H(j\overline{\omega})$, for example. According to the present embodiment, this is sufficient estimation of the value of $H_H(s)$ to provide suitable force control accuracy and stability for the imprint apparatus. Referring now also to FIG. 5, there is shown an example of the spectrum "Cool down" identified using system identification based on the PRBS exciting signal $T_C(t)$ and measured resulting temperature $T_M(t)$ over time in the metrology frame M. The system identification graph of $H_C(s)$ in this example is limited to that portion of the complex spectrum $H_C(s)$ that lies on the imaginary axis in the s-domain, that is the amplitude of $H_C(j\overline{\omega})$, for example. According to the present embodiment, this is sufficient estimation of the value of $H_C(s)$ to provide suitable force control accuracy and stability for the imprint apparatus.

Figure 6:
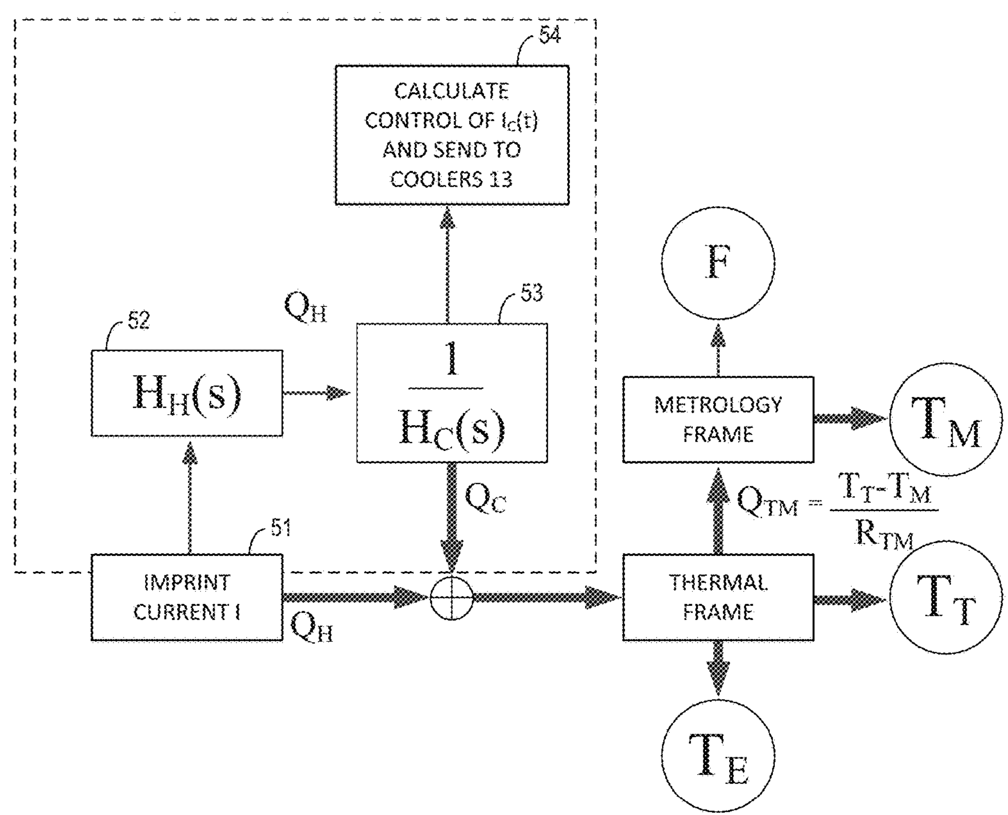
FIG. 6 is a flow diagram of computations to provide an appropriate value of the complex spectrum of the current $I_C(s)$ to be applied to the electronic coolers in accordance with an aspect of the present invention.
Figure 7:
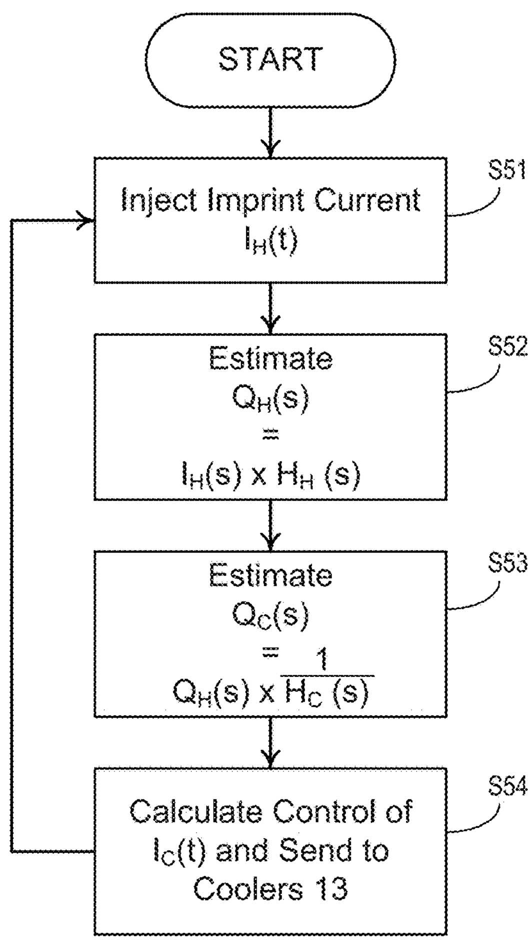
FIG. 7 is a flowchart corresponding to the flow diagram of FIG. 6 in accordance with an aspect of the present invention.

Referring now to FIGS. 6 and 7, in accordance with the present embodiment, there is shown a flow diagram (FIG. 6) and corresponding flowchart (FIG. 7) of computations to provide an appropriate value of the complex spectrum of the current $I_C(s)$ to be applied to the electronic coolers 13 to maintain the imprint apparatus at or very near thermal equilibrium can be modelled. First, in step S51 represented by block 51, the drive current $I_H(t)$ is injected into the voice coils 15 thus producing heat in the thermal frame T at the voice coils 15. Next, in step S52 represented by block 52, the feedforward temperature control of thermal/metrology frame based on identified model (shown in FIG. 6), the heat $Q_H(s)$ generated by lithography process (that is by the drive current $I_H(s)$ injected into thermal frame at the voice coils 15) is first estimated with identified model $H_H(s)$ with the drive current $I_H(t)$ as input, and the value of the imprint current $I_H(t)$ injected in step S51 is run through a first filter having transfer function $H_H(s)$. Next, in step S53 represented by block 53, using the estimate $Q_H(s)$, a value of feedforward control effort $Q_C(s)$ which will balance the generated heat is calculated based on identified inverse model $1/H_C(s)$, and the output from the filter used in step S52 is run through a second filter having transfer function $1/H_C(s)$. Next, in step S54 represented by block 54, a control signal for the current $I_C(t)$ is calculated based on the feedforward control effort $Q_C$ calculated in step S3. The feedforward control signal that controls $I_C(t)$ is sent before, at same time, or later than imprint process control signal based on identified model cooling actuator to improve control accuracy of thermodynamic equilibrium and to avoid issues in feedback loop caused by slow response of thermal system in metrology frame. The summation sign shown to the right of block 51 and below block 53 represents that the heating provided by the voice coils 15 and the cooling provided by the electric coolers 13 has a net impact on the heat flow into (and hence the temperature of) the thermal frame T.

For example, the transfer functions $H_H(s)$ and $1/H_C(s)$ can be transformed by the digital controller 17 into the continuous time domain by computing their inverse Laplace Transforms to obtain corresponding impulse responses $h_H(t)$ and $g_C(t)$ in the time domain (where $g_C(t)$ represents the inverse Laplace transform of $1/H_C(s)$). The value of the imprint current $I_H(t)$ injected in Step S51 can next be run through both impulse responses $h_H(t)$ and $g_C(t)$ by the digital controller 17 (e.g. by computing the convolution $I_H(t)*h_H(t)$ in Step S52, and then computing the outer convolution $[I_H(t)*h_H(t)]*g_C(t)$ in Step S53. The result obtained represents the appropriate value of the electric cooler current $I_C(t)$ to be supplied to the electric coolers 13. In step S54, the appropriate level of the electric cooler current $I_C(t)$ is converted to a control signal which will cause the current source 34 to supply that appropriate level of current to the electric coolers 34 via conductive lines 36. The conversion to a control signal depends on the particular structure of current source 34 used, and can be readily determined using the data sheet or spec sheet of that current source 34.

As an alternative example, one of ordinary skill in the art will appreciate that the value of the imprint current $I_H(t)$ injected in step S51 can alternatively be converted to a discrete time signal $I_H[n]$, and then run through corresponding discrete time inverse transforms $h_H[n]$ and $g_C[n]$ to obtain a discrete time representation $I_C[n]$ of the appropriate level of current to be supplied to the electric coolers 13 in a similar manner.

As another alternative, by rearranging the terms of Expressions 11 and 12, a suitable value of the complex spectrum $I_C(s)$ can be obtained based on Expressions 11 and 12 (Ex. 11 and Ex. 12) by computing Expression 15 (Ex. 15) provided below on a regular basis:

$$I_C(s)=\{H_H(s)/H_C(s)\}\times I_H(s)=H_{HC}(S)\times I_H(S) \quad \text{(Ex. 15)},$$

and in the time domain, the feed forward current can be calculated by convolution using Expression 16 (Ex. 16) provided below:

$$I_C(t) = I_H(t) * h_{HC}(t) = \int_{-\infty}^{t} I_H(\tau) h_{HC}(t-\tau)\, d\tau, \quad \text{(Ex. 16)}$$

wherein $H_{HC}(S)=H_H(S)/H_C(s)$, $H_H(S)$, and $H_C(s)$ are limited to the values of $s=j\omega$ and moreover in this embodiment are not updated during a batch of the imprinting process, and wherein $Q_C(s)=C\times T_C(s)$ and $Q_H(s)=C\times T_H(s)$ can be obtained from Expression 7. Note that values of $T_C(s)$ and $T_H(s)$ are estimates based on the currently available temperature history, and hence can be updated on a regular basis, for example over several months at initial set up, as the actual temperature history becomes available. Based on current observation, the identified modelling is highly stable when there is no big change in hardware and/or the environment. Big changes to the hardware (such as installation of new magnets) and/or the environment (such as installation of hardware upgrades to the environmental control system) provide a good point to update identified model with new history data, for example using an adaptive feedback control scheme, once the new history data becomes available. In an alternative embodiment, modelling can be performed in a discrete time domain, for example, as follows:

$$I_C[n] = I_H[n] * h_{HC}[n] = \sum_{k=0}^{N} I_H[k] h_{HC}[n-k], \quad \text{(Ex. 17)}$$

wherein $h_{HC}[n]$ may represent a sampled version of $h_{HC}(t)$, or alternatively, may be transformed from a z-domain representation. For example, $H_{HC}(s)$ may be transformed to the z-domain by bilinear transformation (or alternatively another known transformation) to provide a z-domain representation $H_{HC}(Z)$, and then $H_{HC}(z)$ may be transformed to the time domain using an inverse discrete-time Fourier Transform (DTFT) to provide $h_{HC}[n]$. Again, alternatively, a discrete frequency domain may be used in conjunction with the Discrete Fourier Transform (DFT) and/or the Fast Fourier Transform (FFT). The values of Expressions 15-17 (Ex. 15-17) are preferably recomputed on a regular basis (for example, between about 1 KHz and 10 KHz suffices).

An example of thermal control by the present embodiment is depicted in FIG. 6, wherein the actual imprint current $I_H(s)$ produces heat $H_H(s)$ in the voice coils 15, and the value of $I_H(s)$ is multiplied by the estimated transfer function $H_H(S)$ and a computed value of the estimated inverse of transfer function $H_C(s)$ (i.e. divide by $H_C(s)$) to provide the value of the heat that is to be absorbed by the electronic coolers 13, which yields minimal net heating in the thermal frame T and no heat transfer (or nearly no heat transfer) to the metrology frame M, especially if high quality thermal isolators 12 are used. Referring now back to FIG. 1, the bottom graphed portion indicates the thermal performance provided by an embodiment of the present invention relative to the poor performance with zero drift provided without sufficient thermal control as can be seen in the top graphed portion of FIG. 1.

In the above discussed embodiments, the transfer functions are computed as a functions of a frequency variable, for example a complex variable s or a real variable m. However, in alternative embodiments one or more of the transfer functions is computed as function of time, with the combined effects of the transfer functions being provided, for example, by performing time domain convolution.

Figure 8:
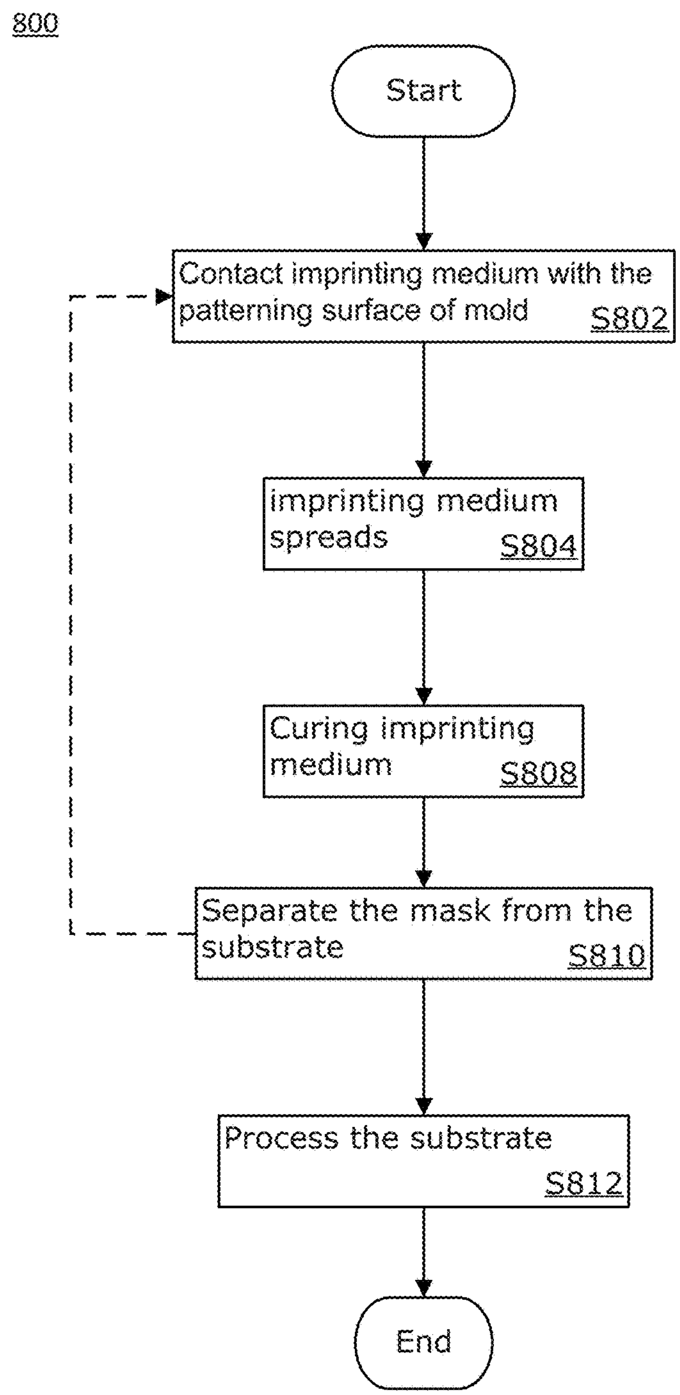
FIG. 8 is a flowchart of an embodiment of a shaping process performed by an imprint apparatus that can be used to form patterns in the imprinting medium on one or more imprint fields.

Referring now also to FIG. 8, there is shown a flowchart of an embodiment of a shaping process 800 performed by the imprint apparatus 100 that can be used to form patterns in the imprinting medium on one or more imprint fields. The shaping process 800 may be performed repeatedly on a plurality of substrates 9 by the imprint apparatus 100. The digital controller 17 under control of a control program is used to control the shaping process 800.

In an alternative embodiment, the shaping process 800 is used to planarize the substrate 9 at one or more layers. In which case, the patterning surface of the imprinting mold is preferably the same size or larger than the substrate 9 and is featureless.

The beginning of the shaping process 800 may include a imprinting mold mounting step causing a imprinting mold conveyance mechanism to mount a imprinting mold onto the imprinting mold chuck 8. The shaping process may also include a substrate mounting step, the digital controller 17 causes a substrate conveyance mechanism to mount the substrate 9 onto the substrate chuck. The substrate may have one or more coatings and/or structures. The order in which the imprinting mold and the substrate 9 are mounted onto the imprint apparatus 100 is not particularly limited, and the imprinting mold and the substrate 9 may be mounted sequentially or simultaneously.

In a positioning step, the digital controller 17 causes one or both of the substrate positioning stage 3 and a dispenser positioning stage (not illustrated) to move an imprinting field i (index i may be initially set to 1) of the substrate 9 to a fluid dispense position below a fluid dispenser. The substrate 9, may be divided into N imprinting fields, wherein each imprinting field is identified by an index i, and in which N is a positive integer such as 1, 10, 75, etc., also referred to as $\{N \in \mathbb{Z}^{+}+\}$. In a dispensing step, the digital controller 17 causes the fluid dispenser to dispense imprinting medium onto imprinting field i. In an embodiment, the fluid dispenser dispenses the imprinting medium as a plurality of droplets. The fluid dispenser may include one nozzle or multiple nozzles. The fluid dispenser may eject imprinting medium from the one or more nozzles simultaneously. The imprint field i may be moved relative to the fluid dispenser while the fluid dispenser is ejecting imprinting medium. Thus, the time at which some of the droplets land on the substrate may vary across the imprint field i.

In an alternative embodiment, the imprinting medium is dispensed onto the substrate 9 prior to the substrate 9 being mounted on the substrate chuck. Other methods besides drop dispense may be used to deposit the imprinting medium onto the substrate 9, such as spin coating, dip coating, spray coating, etc.

After, the droplets are dispensed, then a contacting step S802 may be initiated, the digital controller 17 causes one or both of the substrate positioning stage and a imprinting mold positioning stage to bring the patterning surface of the imprinting mold into contact with the imprinting medium in imprinting field i.

During a spreading step S804, the imprinting medium spreads out towards the edge of the imprinting field, or if planarization is being performed towards the edge of the substrate 9.

In a curing step S808, the digital controller 17 causes an ultraviolet (UV) light source 126 to send a curing illumination pattern of actinic radiation through the imprinting mold and the patterning surface. The curing illumination pattern provides enough energy to induce the curing (polymerization) of the imprinting medium under the patterning surface.

In a separation step S810, the digital controller 17 uses one or both of the substrate positioning stage 3 and a imprinting mold positioning stage to separate the patterning surface of the imprinting mold from the cured imprinting medium on the substrate 9.

If there are additional imprinting fields to be imprinted then the shaping process 800 loops back step S802. In an embodiment, additional processing is performed on the substrate 9 in a processing step S812 so as to create an article of manufacture (semiconductor device). In an embodiment, each imprinting field includes a plurality of devices.

The further optional processing in processing step S812 may include etching processes to transfer a relief image into the substrate that corresponds to the pattern in the patterned layer. The further optional processing in processing step S812 may also include known steps and processes for article fabrication, including, for example, curing, oxidation, layer formation, deposition, doping, planarization, etching, imprinting medium removal, dicing, bonding, and packaging, and the like. The substrate 9 may be processed to produce a plurality of articles (devices).

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While aspects of the present invention have been described with reference to exemplary embodiments, it is to be understood that aspects of the invention are not limited to the disclosed exemplary embodiments. The scope of the following claims is to be accorded the broadest interpretation so as to encompass all such modifications and equivalent structures and functions.

What is claimed is:

1. An imprint apparatus comprising:

a first frame having at least one motor and at least one cooling element;

a second frame coupled to an output end of the motor and having a surface configured to attach an imprinting mold;

a plurality of thermal sensors disposed at locations of the first frame and the second frame; and a digital controller that is configured to apply a control signal for controlling a driving signal of the at least one cooling element to maintain a thermal balance of heat flow from the first frame to the second frame, wherein the digital controller uses output of the plurality of thermal sensors to calculate a first transfer function of estimated heat flow provided by the motor between the first frame and the second frame and to calculate an inverse of a second transfer function of estimated heat flow of the cooling element between the first frame and the second frame, wherein the digital controller calculates the control signal by running the value of a drive current, which powers the motor, through both the first transfer function and the inverse of the second transfer function to provide a value of the cooling current to be provided to the at least one cooling element to maintain the thermal balance, and wherein at least one of the first transfer function and the second transfer function is used to calculate feedforward control effort.

2. The imprint apparatus according to claim 1, wherein both the first transfer function and the second transfer function are used to calculate feedforward control efforts.

3. The imprint apparatus according to claim 1, wherein at least one of the first transfer function and the second transfer function is feedback free.

4. The imprint apparatus according to claim 1, wherein both the first transfer function and the second transfer function are feedback free.

5. The imprint apparatus according to claim 1, further comprising at least one thermal insulator wherein both the first transfer function and the second transfer function are feedback free.

6. The imprint apparatus according to claim 1, wherein the first transfer function and the second transfer function are functions of frequency.

7. The imprint apparatus according to claim 1, wherein the first transfer function and the second transfer function are functions of frequency which can be transformed into impulse response in time domain, and wherein the digital controller calculates the control signal by running the value of the drive current through both the first transfer function and the second inverse transfer function using time domain convolution.

8. The imprint apparatus according to claim 1, wherein at least the second transfer function is estimated as a frequency domain function that is not updated throughout an imprinting processing batch.

9. The imprint apparatus according to claim 1, further comprising at least one thermal isolator that thermally isolates at least a portion of the first frame from the second frame.

10. The imprint apparatus according to claim 1, further comprising at least one thermal isolator disposed between the output end of the motor the second frame, wherein the second frame is coupled to the output end of the motor via the at least one thermal isolator.

11. The imprint apparatus according to claim 1, wherein the at least one motor includes at least one voice coil disposed around a magnet.

12. The imprint apparatus according to claim 1, wherein the at least one cooling element comprises a thermoelectric cooler, to support simplified calculation of the inverse of the second transfer function as a scaling factor.

13. The imprint apparatus according to claim 1, wherein the thermal balance comprises maintaining the first frame at least near to thermal equilibrium with the second frame.

14. The imprint apparatus according to claim 1, wherein the thermal balance comprises maintaining the second frame at least near to thermal equilibrium with surrounding air.

15. The imprint apparatus according to claim 1, wherein the thermal balance comprises maintaining the first frame and the second frame at least near to thermal equilibrium with a surrounding controlled air environment.

16. The imprint apparatus according to claim 1, wherein the feedforward control provides a thermal coupling of the temperature at least one of the first frame and the second frame to a surrounding controlled environment provided by an environmental control unit, so as to improve thermal control of the imprint apparatus using the thermal control of the surrounding controlled environment provided by the environmental control unit.

17. The imprint apparatus according to claim 1, wherein the feedforward control adjusts the temperature at least one of the first frame and the second frame to a surrounding controlled environment provided by an environmental control unit, so as to improve thermal control of the imprint apparatus using the thermal control of the surrounding controlled environment provided by the environmental control unit.

18. A method of providing thermal control to an imprint apparatus, the imprint apparatus comprising a first frame having at least one motor and at least one cooling element, a second frame coupled to an output end of the motor and having a surface configured to receive an imprinting mold, and a plurality of thermal sensors disposed at locations of the first frame and the second frame, the method comprising:

applying a control signal for controlling a driving signal of the at least one cooling element to maintain a thermal balance of heat flow from the first frame to the second frame;

using output of the plurality of thermal sensors to calculate a first transfer function of estimated heat flow provided by the motor between the first frame and the second frame and to calculate an inverse of a second transfer function of estimated heat flow of the cooling element between the first frame and the second frame; and calculating the control signal by running the value of the a drive current, which powers the motor, through both the first transfer function and the inverse of the second transfer function to provide a value of the cooling current to be provided to the at least one cooling element to maintain the thermal balance, wherein at least one of the first transfer function and the second transfer function is used to calculate feedforward control efforts.

19. A method of manufacturing an imprinted product, the method comprising:

attaching the imprinting mold to the surface of the second frame of the imprinting apparatus of claim 1; and using the imprint apparatus according to claim 1 to imprint the a patterning surface of imprinting mold on an imprinting medium that has been applied to a substrate.

* * * * *